(12) United States Patent
Yu et al.

(10) Patent No.: US 9,356,147 B2
(45) Date of Patent: May 31, 2016

(54) FINFET SPACER ETCH FOR ESIGE IMPROVEMENT

(71) Applicant: GLOBALFOUNDRIES Inc., Grand Cayman (KY)

(72) Inventors: Hong Yu, Rexford, NY (US); Hyucksoo Yang, Watervliet, NY (US); Puneet Khanna, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 136 days.

(21) Appl. No.: 13/918,622

(22) Filed: Jun. 14, 2013

(65) Prior Publication Data
US 2014/0367751 A1    Dec. 18, 2014

(51) Int. Cl.
*H01L 21/8234* (2006.01)
*H01L 29/78* (2006.01)
*H01L 29/66* (2006.01)

(52) U.S. Cl.
CPC ........ *H01L 29/785* (2013.01); *H01L 29/66795* (2013.01); *H01L 21/823431* (2013.01)

(58) Field of Classification Search
CPC ............. H01L 2924/13067; H01L 21/823431; H01L 21/823821; H01L 21/845; H01L 27/0886; H01L 27/0924; H01L 27/1211; H01L 29/41791; H01L 29/66772; H01L 29/66795; H01L 21/823437; H01L 21/823828
See application file for complete search history.

(56) References Cited

U.S. PATENT DOCUMENTS

| | | | |
|---|---|---|---|
| 2005/0077553 A1* | 4/2005 | Kim | H01L 21/823412 257/288 |
| 2008/0099785 A1* | 5/2008 | Bai et al. | 257/190 |
| 2011/0201164 A1* | 8/2011 | Chung et al. | 438/229 |
| 2014/0363935 A1* | 12/2014 | Fu | H01L 29/66545 438/164 |

OTHER PUBLICATIONS

Taiwan Office Action for related Taiwan Patent Application No. 102149238 dated Jun. 22, 2015, 4 pages.

* cited by examiner

*Primary Examiner* — Evan Pert
*Assistant Examiner* — Leslie Pilar Cruz
(74) *Attorney, Agent, or Firm* — Ditthavong & Steiner, P.C.

(57) ABSTRACT

A method for etching FinFET spacers by inserting a Si recess step directly after the traditional spacer ME step and the resulting device are provided. Embodiments include forming a gate on a substrate having a silicon fin, the gate having a nitride cap on an upper surface thereof and an oxide cap on an upper surface of the nitride cap; forming a dielectric layer over the silicon fin and the gate; removing the dielectric layer from an upper surface of the oxide cap and an upper surface of the silicon fin; recessing the silicon fin; and removing the dielectric layer from side surfaces of the silicon fin and the remaining silicon fin.

18 Claims, 3 Drawing Sheets

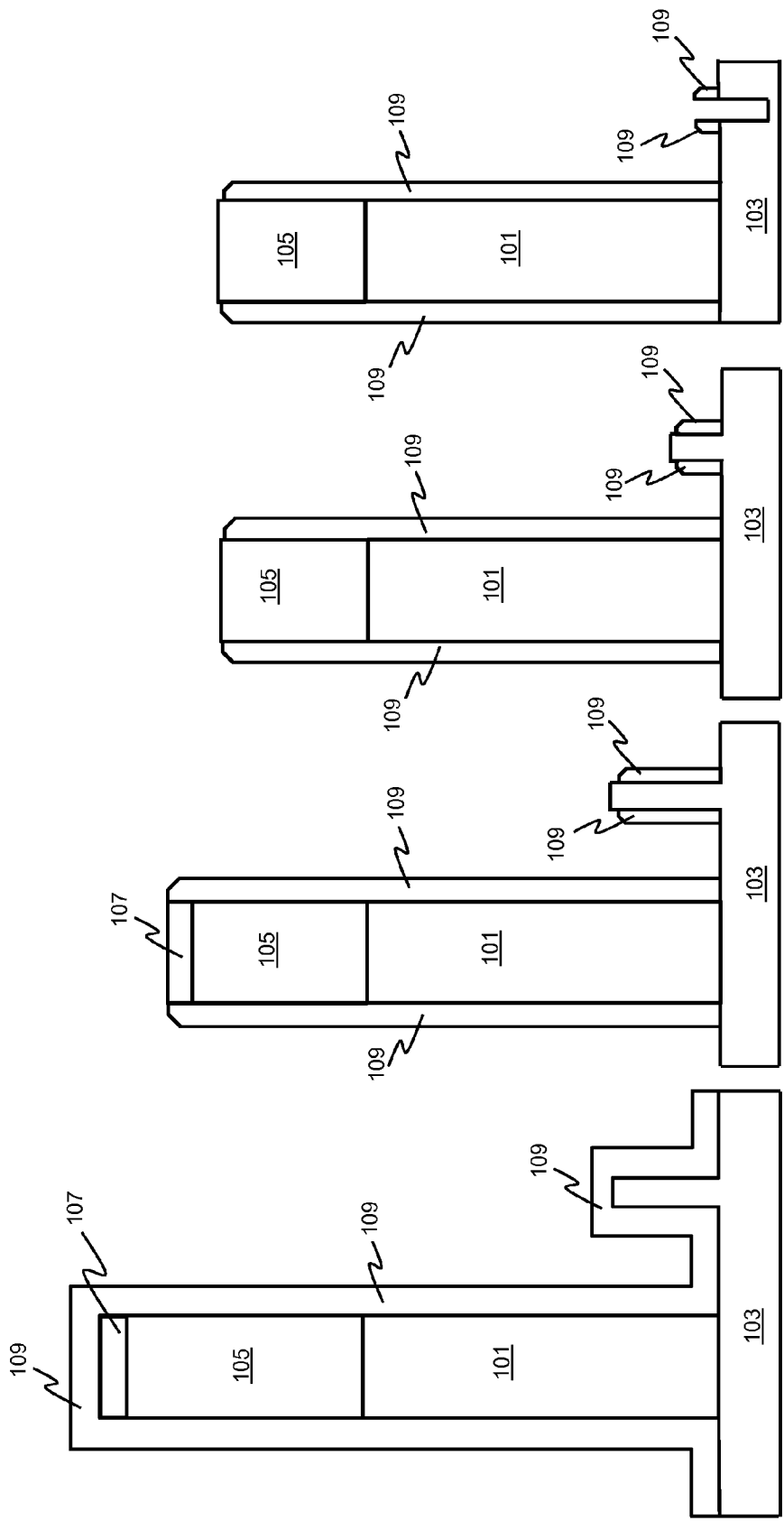

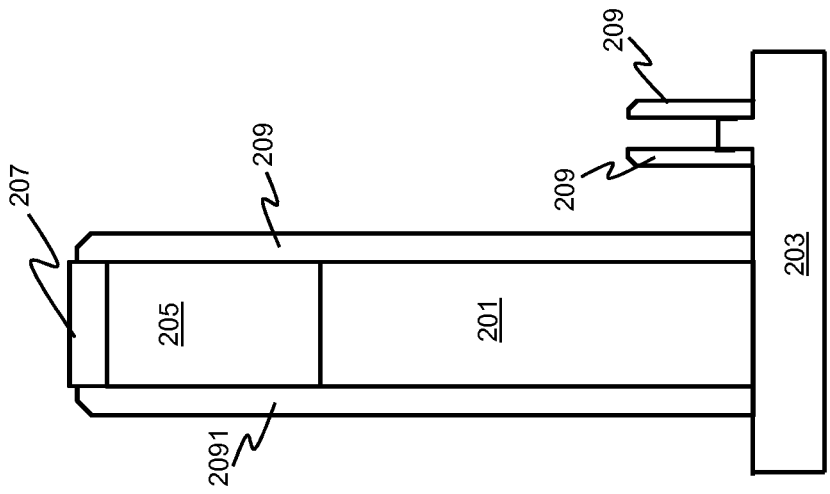
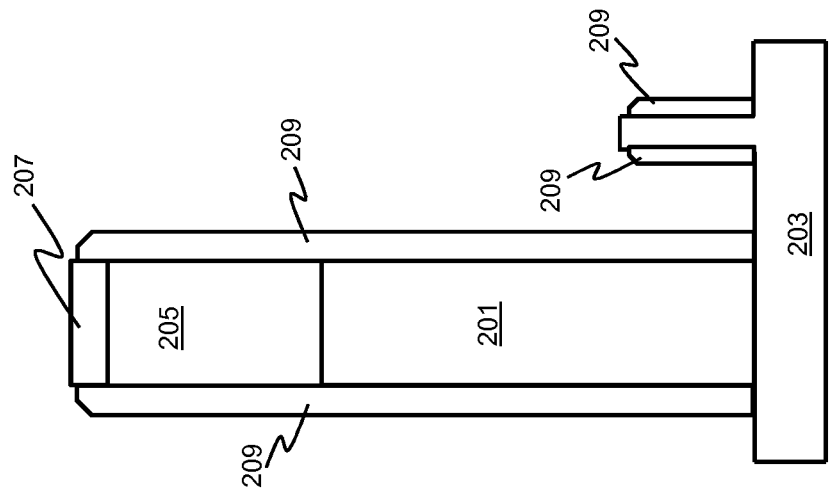
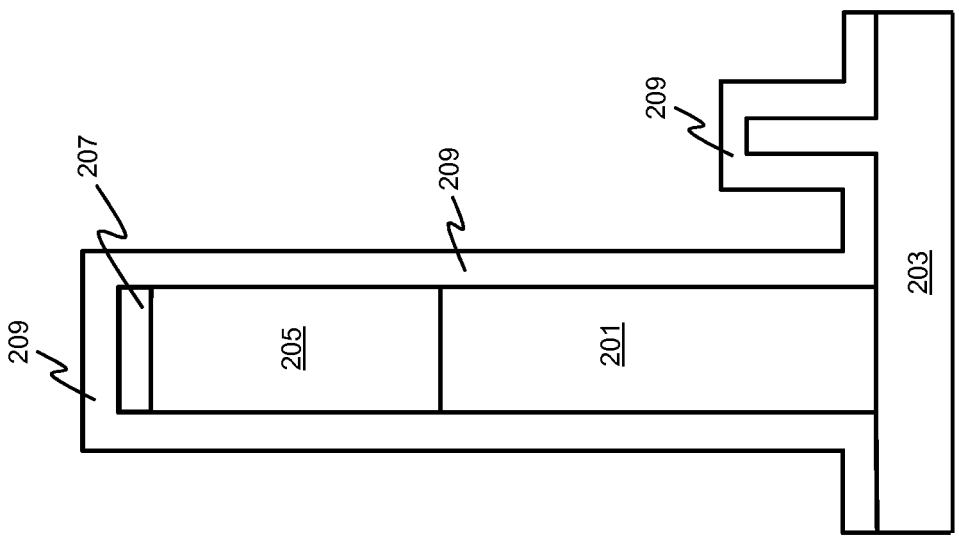

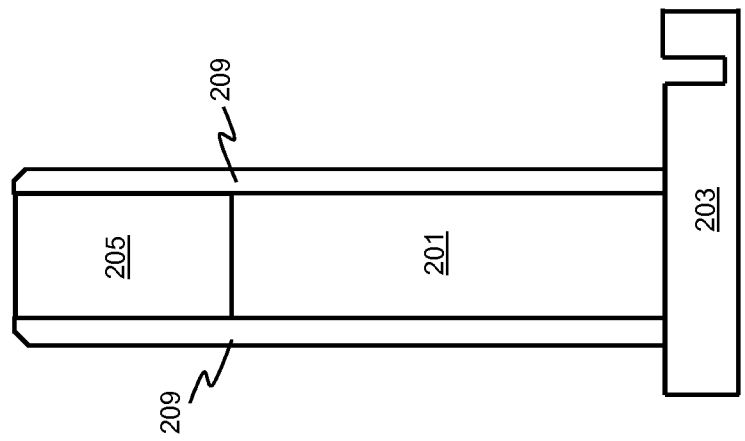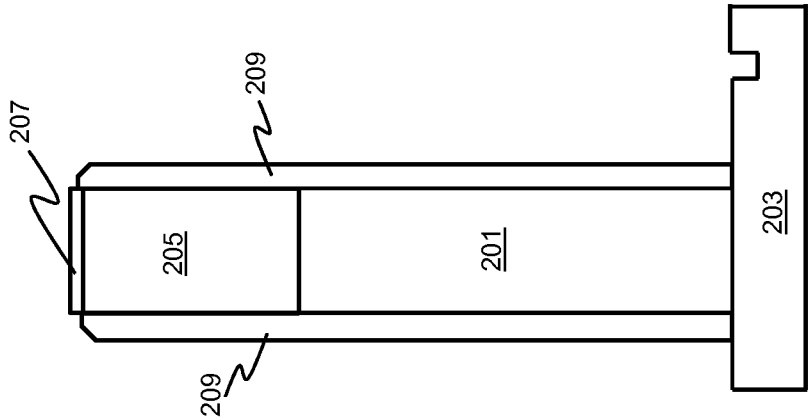

FINFET SPACER ETCH FOR ESIGE IMPROVEMENT

TECHNICAL FIELD

The present disclosure relates to FinFET spacer etching. The present disclosure is particularly applicable to 14 nanometer technology nodes and beyond.

BACKGROUND

Spacer etching poses a challenge for fabricating FinFET devices. In particular, the fin spacer must be completely removed. Failure to remove the spacer can induce embedded silicon germanium (eSiGe) defects, and can also introduce electrical performance degradation. Removing the spacer with a large nitride etch can cause significant nitride cap loss, which can lead to an overlap nitride bump or potential excessive gate spacer thinning. A high overlap nitride bump can give rise to a large burden for the downstream poly open process, and gate spacer thinning may lead to unwanted epitaxial growth during the eSiGe or embedded silicon phosphide (eSiP) processes.

A known approach for FinFET spacer etching involves four steps: 1) spacer deposition; 2) spacer main etch (ME); 3) spacer over etch (OE); and 4) silicon (Si) recess, as illustrated in FIGS. 1A through 1D, respectively. During the spacer deposition step (FIG. 1A), a gate 101 is first formed on a substrate 103 having a silicon fin, the gate 101 having a nitride cap 105 on an upper surface thereof and an oxide cap 107 on an upper surface of the nitride cap 105. In particular, the silicon fin may be part of the substrate 101 or it may be formed distinct from the substrate 101. Thereafter, a dielectric layer 109, e.g., silicon nitride ($Si_3N_4$), silicon dioxide ($SiO_2$), ceramic coating (SiOCN), boroncarbonitride (SiBCN), or any common dielectric material used in the semiconductor industry, is formed over the silicon fin of the substrate 103 and the gate 101. Next, as illustrated in FIG. 1B, during the spacer ME step, the dielectric layer 109 is removed from all horizontal surfaces, e.g., the upper surface of the oxide cap 107, an upper surface of the silicon fin of the substrate 103, and the substrate 103. During the spacer OE step (FIG. 1C), portions of the dielectric layer 109 from the side surfaces of the gate 101 and the silicon fin of the substrate 103 are removed along with the oxide cap 107. In addition, portions of the nitride cap 105 and portions of the silicon fin of the substrate 103 are also removed. Last, during the Si recess step, additional portions of the dielectric layer 109 are removed from the side surfaces of the silicon fin of the substrate 103 along with the remaining portion of the silicon fin, as shown in FIG. 1D. A portion of the substrate 105 below the silicon fin 101 is also recessed. However, some of the dielectric layer 109 remains adjacent to the recess in the substrate 103. Further processing to remove the remaining dielectric layer 109 would also remove part of the nitride cap 105 and/or would thin the gate spacers.

A need therefore exists for methodology removing the whole dielectric spacer from the side surfaces of the fin faster than after recessing the fin and without large nitride cap loss, and the resulting device.

SUMMARY

An aspect of the present disclosure is a method of FinFET spacer etching including a Si recess step directly after the traditional spacer ME step.

Another aspect of the present disclosure is a FinFET device including a recess in the silicon wafer proximate to the gate, the recess having no dielectric spacers on the silicon wafer at opposite sides of the recess.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming a gate on a substrate having a silicon fin, the gate having a nitride cap on an upper surface thereof and an oxide cap on an upper surface of the nitride cap; forming a dielectric layer over the silicon fin and the gate; removing the dielectric layer from an upper surface of the oxide cap and an upper surface of the silicon fin; recessing the silicon fin; and removing the dielectric layer from side surfaces of the silicon fin and the remaining silicon fin.

Aspects of the present disclosure include recessing the silicon fin to a depth of 0 angstroms (Å) to 700 Å. Other aspects include recessing the silicon fin with an etchant selective to oxide and nitride. Further aspects include using the dry etchants such as, but not limited to, hydrogen bromide (HBr), sulfur hexafluoride ($SF_6$), nitrogen trifluoride ($NF_3$), carbon tetrafluoride ($CF_4$), or other fluorine based chemistries, or wet etchants such as, but not limited to, tetra-methyl-ammonium hydroxide (TMAH), tetra-ethyl-ammonium hydroxide (TEAH), potassium hydroxide (KOH), ammonium hydroxide ($NH_4OH$), etc. Another aspect includes removing the dielectric layer from the side surfaces of the silicon fin by etching. Other aspects include etching the dielectric layer from the side surfaces of the silicon fin with an etchant selective to oxide and silicon. Further aspects include using dry etchants such as, but not limited to, trifluoromethane ($CHF_3$), flouromethane ($CH_3F$), difluoromethane ($CH_2F_2$), $CF_4$, or other hydrocarbons or wet etchants such as phosphoric acid ($H_3PO_4$). Additional aspects include recessing the substrate below the fin. Another aspect includes recessing the substrate below the fin to a depth of 0 Å to 700 Å. Other aspects include recessing the substrate by etching. Further aspects include etching the substrate with an etchant selective to nitride, wherein the etchant includes dry etchants such as, but not limited to, HBr, $SF_6$, $NF_3$, $CF_4$, or other fluorine based chemistries, or wet etchants such as, but not limited to, TMAH, TEAH, KOH, $NH_4OH$. Additional aspects include removing the dielectric layer from the upper surface of the oxide cap and the upper surface of the silicon fin by etching. Another aspect includes forming the dielectric layer by blanket deposition to a thickness of 50 Å to 250 Å. Other aspects include forming the dielectric layer of silicon nitride or other dielectrics including low-k dielectrics such as, but not limited to, SiOCN or SiBCN.

Another aspect of the present disclosure is a device including: a silicon wafer; a gate on the silicon wafer, the gate having a nitride cap on an upper surface thereof; dielectric spacers on side surfaces of the gate and the nitride cap; and a recess in the silicon wafer proximate to the gate, the recess having no dielectric spacers on the silicon wafer at opposite sides of the recess. Aspects of the device include the recess having a depth of 0 Å to 700 Å.

Another aspect of the present disclosure is a method including: forming a silicon fin and a silicon gate proximate to the silicon fin on a silicon wafer, the silicon gate having a nitride cap on an upper surface thereof and a oxide cap on an upper surface of the nitride cap; blanket depositing a silicon dielectric layer over the silicon fin, the silicon gate, and the silicon wafer; etching the silicon dielectric layer from an upper surface of the oxide cap, an upper surface of the silicon fin, and an upper surface of the silicon wafer with etchants such as, but not limited to, $CHF_3$, $CH_3F$, $CH_2F_2$, $CF_4$ or other hydrocarbons or wet etchants such as $H_3PO_4$; recessing the silicon fin to a depth of 50 Å to 700 Å; and etching the silicon dielectric layer from side surfaces of the silicon fin and removing the remaining silicon fin with dry etchants such as, but not limited to HBr $SF_6$, $NF_3$, HBr, $CF_4$, or other fluorine based chemistries, or wet etchants such as, but not limited to, TMAH, TEAH, KOH, or NH4OH. Other aspects include recessing the first portion of the silicon fin with dry etchants such as, but not limited to, HBr $SF_6$, $NF_3$, HBr, $CF_4$, or other fluorine based chemistries, or wet etchants such as, but not limited to, TMAH, TEAH, KOH, or $NH_4OH$. Further aspects include recessing the silicon substrate below the fin to a depth of 0 Å to 700 Å. Additional aspects include the silicon gate having an oxide cap on an upper surface of the nitride cap.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1D schematically illustrate sequential steps of a background method of FinFET spacer etching; and FIGS. 2A through 2E schematically illustrate sequential steps of a method of FinFET spacer etching, in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of potential eSiGe defects and large nitride cap loss attendant upon fin spacer removal during the FinFET fabrication process. Moreover, large nitride cap loss can lead to a high overlap nitride bump, e.g., a 300 Å bump, or a potential for excessive gate spacer thinning. In particular, a high overlap nitride bump can give rise to a large burden for the downstream poly open process, and gate spacer thinning may lead to unwanted epitaxial growth during eSiGe or eSiP processes.

Methodology in accordance with embodiments of the present disclosure includes forming a silicon fin and a gate on a substrate, the gate having a nitride cap on an upper surface thereof and an oxide cap on an upper surface of the nitride cap. A dielectric layer is formed over the silicon fin and the gate. The dielectric layer is removed from an upper surface of the oxide cap and an upper surface of the silicon fin. The silicon fin is recessed. The dielectric layer is removed from side surfaces of the silicon fin and the remaining silicon fin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 2A, during the spacer deposition step, a gate 201 is first formed on a substrate 203 having a silicon fin, the gate 201 having a nitride cap 205 on an upper surface thereof and an oxide cap 207 on an upper surface of the nitride cap 205. More specifically, the silicon fin of substrate 203 may be distinctly formed from the substrate 203 or it may be part of the substrate 203. Thereafter, a dielectric layer 209, e.g., silicon nitride or a low-k material such as SiOCN or SiBCN, is blanket deposited over the silicon fin of substrate 203 and the gate 201 to a thickness of 50 Å to 250 Å. Next, during the spacer ME step, the dielectric layer 209 is removed from horizontal surfaces including the upper surface of the oxide cap 207, an upper surface of the silicon fin, and the substrate 203 by etching, as illustrated in FIG. 2B. Subsequently, during the inserted first Si recess step, shown in FIG. 2C, the silicon fin of substrate 203 is recessed to a depth of 50 Å to 700 Å with an etchant selective to oxide and nitride, e.g., dry etchants such as, but not limited to, HBr $SF_6$, $NF_3$, HBr, $CF_4$, or other fluorine based chemistries or wet etchants such as, but not limited to, TMAH, TEAH, KOH, or $NH_4OH$.

Once the silicon fin of the substrate 203 is recessed, the spacer OE step follows as illustrated in FIG. 2D. In particular, the dielectric layer 209 from the side surfaces of the silicon fin of the substrate 203 and the silicon fin are removed by etching with an etchant that is selective to oxide and silicon, e.g., etchants such as, but not limited to, $CHF_3$, $CH_3F$, $CH_2F_2$, $CF_4$, or other hydrocarbons or wet etchants such as $H_3PO_4$. The substrate 203 below the silicon fin is also recessed to a depth of 0 Å to 700 Å. Alternatively, an additional Si recess step may be performed as illustrated in FIG. 2E. During this additional Si recess step the oxide cap 207 is also removed.

The embodiments of the present disclosure can achieve several technical effects including reducing the amount of time needed to clear the whole spacer dielectric from the sides of the silicon fin during the spacer OE step, which in turn can lead to less overlap bump height. For example, the dielectric sidewall on the silicon fin can be removed faster than possible without first doing the fin recess step. Further, clearing the whole spacer dielectric can improve process margins. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including FinFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate on a substrate having a silicon fin, the gate having a nitride cap on an upper surface thereof and an oxide cap on an upper surface of the nitride cap;
   forming a dielectric layer over the silicon fin and the gate;
   removing the dielectric layer from an upper surface of the oxide cap and an upper surface of the silicon fin;
   recessing the silicon fin within the dielectric layer, leaving a remaining portion of the silicon fin after the recessing; and
   removing the dielectric layer from side surfaces of the silicon fin and removing the entire remaining portion of the silicon fin.

2. The method according to claim 1, comprising recessing the silicon fin to a depth of 50 angstroms (Å) to 700 Å.

3. The method according to claim 1, comprising recessing the silicon fin with an etchant selective to oxide and nitride.

4. The method according to claim 3, wherein the etchant comprises of dry etchants including hydrogen bromide (HBr), sulfur hexafluoride ($SF_6$), nitrogen trifluoride ($NF_3$), carbon tetrafluoride ($CF_4$), or other fluorine based chemistries or wet etchants including tetra-methyl-ammonium hydroxide (TMAH), tetra-ethyl-ammonium hydroxide (TEAH), potassium hydroxide (KOH), or ammonium hydroxide ($NH_4OH$).

5. The method according to claim 1, comprising removing the dielectric layer from side surfaces of the silicon fin by etching.

6. The method according to claim 5, comprising etching the dielectric layer from side surfaces of the silicon fin with an etchant selective to oxide and silicon.

7. The method according to claim 6, wherein the etchant comprises of dry etchants including trifluoromethane ($CHF_3$), flouromethane ($CH_3F$), difluoromethane ($CH_2F_2$), $CF_4$, or other hydrocarbons or wet etchants including phosphoric acid ($H_3PO_4$).

8. The method according to claim 1, comprising recessing the substrate below the fin.

9. The method according to claim 8, comprising recessing the substrate below the fin to a depth of 0 Å to 700 Å.

10. The method according to claim 8, comprising recessing the substrate by:
   etching.

11. The method according to claim 10, comprising etching the substrate with an etchant selective to nitride wherein the etchant comprises dry etchants including HBr $SF_6$, $NF_3$, HBr, $CF_4$, or other fluorine based chemistries or wet etchants including TMAH, TEAH, KOH, or NH4OH.

12. The method according to claim 1, comprising removing the dielectric layer from the upper surface of the oxide cap and the upper surface of the silicon fin by: etching.

13. The method according to claim 1, comprising forming the dielectric layer by blanket deposition to a thickness of 50 Å to 250 Å.

14. The method according to claim 1, wherein the dielectric layer comprises silicon nitride or other dielectrics including low-k dielectrics SiOCN or SiBCN.

15. The method according to claim 1, comprising recessing the substrate below the fin to a depth of 0 Å to 700 Å.

16. A method comprising:
   forming a silicon gate proximate to a silicon fin on a silicon wafer, the silicon gate having a nitride cap on an upper surface thereof;
   blanket depositing a silicon dielectric layer over the silicon fin, the silicon gate, and the silicon wafer;
   etching the silicon dielectric layer from an upper surface of the oxide cap, an upper surface of the silicon fin, and an upper surface of the silicon wafer with dry etchants including $CHF_3$, $CH_3F$, $CH_2F2$, $CF_4$ or other hydrocarbons or wet etchants including $H_3PO_4$;
   recessing the silicon fin within the silicon dielectric layer, leaving a remaining portion of the silicon fin after the recessing having a depth of 50 Å to 700 Å; and
   etching the silicon dielectric layer from side surfaces of the silicon fin and removing the entire remaining portion of the silicon fin with dry etchants including HBr $SF_6$, $NF_3$, HBr, $CF_4$ or other fluorine based chemistries or wet etchants including TMAH, TEAH, KOH, or $NH_4OH$.

17. The method according to claim 16, comprising recessing the silicon fin with dry etchants including HBr, $SF_6$, $NF_3$, HBr, $CF_4$ or other fluorine based chemistries or wet etchants including TMAH, TEAH, KOH, or NH4OH.

18. The method according to claim 16, wherein the silicon gate includes an oxide cap on an upper surface of the nitride cap.

* * * * *